United States Patent [19]

Sakai et al.

[11] Patent Number: 5,462,886
[45] Date of Patent: Oct. 31, 1995

[54] METHOD OF MANUFACTURING A SEMICONDUCTOR ELEMENT

[75] Inventors: Yoshihiko Sakai; Takayuki Yamada, both of Kanagawa, Japan

[73] Assignee: Fuji Xerox Co., Ltd., Tokyo, Japan

[21] Appl. No.: 157,259

[22] Filed: Nov. 26, 1993

[30] Foreign Application Priority Data

Nov. 27, 1992 [JP] Japan .................................. 4-339514

[51] Int. Cl.⁶ ................................................ H01L 21/765
[52] U.S. Cl. .............................. 437/41; 437/187; 437/21; 427/487; 427/485; 148/DIG. 45
[58] Field of Search ........................ 118/723 E; 437/21, 437/41, 909, 181, 187; 427/487, 488, 485

[56] References Cited

U.S. PATENT DOCUMENTS

| | | | |
|---|---|---|---|
| 4,704,299 | 11/1987 | Wielonski et al. | 427/38 |
| 4,983,546 | 1/1991 | Hyun et al. | 437/231 |
| 4,999,215 | 3/1991 | Akagi et al. | 427/41 |
| 5,270,267 | 12/1993 | Ouellet | 437/231 |

FOREIGN PATENT DOCUMENTS 3-157970  7/1991  Japan .

OTHER PUBLICATIONS

Ogawa, "Degradation of Sub-Threshold Characteristics in a—Si TFT with Polyimide Passivation," Extended Abstracts of the 22nd (1990 International) Conference on Solid State Devices and Materials, Sendai, 1990.

Primary Examiner—Olik Chaudhuri
Assistant Examiner—Richard A. Booth
Attorney, Agent, or Firm—Finnegan, Henderson, Farabow, Garrett & Dunner

[57] ABSTRACT

A method of manufacturing a semiconductor element such as a thin film transistor or a photo diode, in which a voltage is applied to an organic insulating layer in the direction vertical to a substrate during a coating process of polyimide constituting the interlayer insulating layer formed over a semiconductor layer, a prebaking process for initial hardening which immediately follows the coating process, and a postbaking process after the pattern formation of the interlayer insulating layer.

5 Claims, 8 Drawing Sheets

METHOD OF MANUFACTURING A SEMICONDUCTOR ELEMENT

BACKGROUND OF THE INVENTION

The present invention relates to a method of manufacturing a semiconductor element such as a thin film transistor used as a drive element for an image sensor or for a flat panel display, and a photo diode used as a photosensing element for an image sensor. More particularly, the present invention relates to a method of manufacturing a semiconductor element improved such that when the semiconductor element is a thin film transistor, its reliability is improved by minimizing a variation of the values of threshold voltage (Vth) as its key characteristic, and when the semiconductor element is a photo diode, its dark/bright current ratio (S/N ratio) is improved.

A conventional thin film transistor of the inverse stagger type uses an amorphous silicon hydride (a-Si:H) as a semiconductor active layer, as shown in a cross section of FIG. 1.

In the structure of this type of thin film transistor (TFT), a gate electrode 2 formed of chromium (Cr) or tantalum (Ta), a gate insulating layer 3 formed of a silicon nitride (SiNx) film, a semiconductor active layer 4 formed of nondoped amorphous silicon hydride (i-a-Si:H), a channel protecting layer 5 formed of a silicon nitride (SiNx) film, an ohmic contact layer 6 formed of $n^+$ amorphous silicon hydride ($n^+$ a-Si:H), a source electrode 7 and a drain electrode 8, an interlayer insulating layer 9 formed of polyimide, and a wiring layer 10 formed of molybdenum (Mo), aluminum (Al) or the like are layered on a glass substrate 1 in this order.

In the thin film transistor thus structured, a state of the interfaces between the gate insulating layer 3 and the semiconductor active layer 4 and between the semiconductor active layer 4 and the channel protecting layer 5 decisively determines the TFT characteristics. Accordingly, it is known that contaminants of the interfaces and electrostatic charges in the vicinity of the interfaces have a great influence on the threshold voltage Vth of the thin film transistor.

A measure practically employed in the manufacturing of the semiconductor element is to successively form those three layers, the gate insulating layer 3, the semiconductor active layer 4, and the channel protecting layer 5 in a vacuum condition. The measure succeeds in preventing the interfaces from being contaminated and hence in minimizing a variation of the TFT characteristics of the manufactured semiconductor element.

A conventional method of manufacturing a thin film transistor will be described with reference to FIGS. 2(a) to 2(d).

The gate electrode 2 of chromium (Cr1) is formed on the glass substrate 1. On the structure, silicon nitride (SiNx) layer of the underlayer as the gate insulating layer 3, an amorphous silicon hydride (a-Si:H) layer as the semiconductor active layer 4, and a silicon nitride (SiNx) layer of the upper layer as the channel protecting layer 5 are successively formed in a vacuum state by a plasma CVD method. The SiNx layer of the upper layer is patterned to form the pattern of the channel protecting layer 5 (see FIG. 2(a)).

An $n^+$ a-Si:H layer as the ohmic contact layer 6, a chromium (Cr2) layer to serve as the source electrode 7 and the drain electrode 8 are formed. The $n^+$ a-Si:H layer, the Cr2 layer, and the a-Si:H layer as the semiconductor active layer 4 are successively patterned to form the semiconductor active layer 4, the ohmic contact layer 6, and the source electrode 7 and the drain electrode 8 (see FIG. 2(b)).

Then, polyimide (PI) is coated by a spin coating method to form a polyimide layer of approximately 1 μm thick to be used as the interlayer insulating layer 9. The coated layer is prebaked for the initial hardening, and then patterned to form, for example, contact holes reaching the source and drain electrodes. Finally, it is post baked to complete the interlayer insulating layer 9 (FIG. 2(c)).

Aluminum (Al) or the like is vapor deposited and patterned to form the wiring layer 10 and the like (FIG. 2(d)). In this way, the conventional thin film transistor of the inverse stagger type is manufactured (reference is made to Japanese Patent Unexamined Publication No. Hei. 3-157970).

However, in the above mentioned TFT manufacturing method, when the interlayer insulating layer 9 is formed by using an organic insulating material such as polyimide (PI), molecules in the polyimide film, immediately after the polyimide coating process, are frequently polarized by an electrostatic field existing therearound. Particularly, when the PI molecules are baked in a state that those are oriented in the direction vertical to the glass substrate 1, the molecules remain not electrically neutralized and are left in the form of fixed charges (see Extended Abstract of the 22nd (1990 International) Conference on Solid State Devices and Materials, Sendai, 1990, pp 1039–1042).

The fixed charges resulting from the polarization of the polyimide molecules will be described with reference to FIGS. 3 to 5. FIG. 3 is a sectional view for explaining fixed charges oriented in a fixed direction, which result from the polarization of polyimide molecules, FIG. 4 is a sectional view showing a thin film transistor in which a top gate electrode 21 is provided above the channel protecting layer 5. FIG. 5 is a graph showing a variation of the threshold voltage Vth with respect to a voltage applied to the top gate electrode 21 of the thin film transistor of FIG. 4.

In the illustration of FIG. 3, by electrostatic charges or the like, the polyimide molecules of the interlayer insulating layer 9 are polarized such that positive charges stay in the upper region of the insulating layer and negative charges stay in the lower region thereof. The interlayer insulating layer 9 is baked in a state that the polarized polyimide molecules are oriented vertically with respect to the glass substrate 1. Due to the fixed charges thus formed, charges are induced in the interface between the channel protecting layer 5 and the semiconductor active layer 4. As a result, the threshold voltage Vth of the thin film transistor is shifted by a quantity necessary for canceling the fixed charges. In the case of FIG. 3, the threshold voltage Vth is increased as compared with a case where the interlayer insulating layer 9 does not include fixed charges.

This state of fixed charge generation in the thin film transistor is equivalent to the state of the thin film transistor when the top gate electrode 21 is provided above the channel protecting layer 5, and a voltage (top gate voltage) is applied to the top gate as shown in FIG. 4.

As shown in FIG. 4, the top gate electrode 21 is formed above the channel protecting layer 5, with the interlayer insulating layer 9 interlayered between them. In the thin film transistor thus structured, charges are induced in the interface between the channel protecting layer 5 and the semiconductor active layer 4 when a voltage is applied to the top gate electrode 21. As seen from the graph of FIG. 5, the threshold voltage Vth greatly varies in accordance with a variation of the voltage applied to the top gate electrode 21. Specifically, the threshold voltage Vth is inversely proportional to the gate voltage. From this fact, it is seen that a degree of the polarization of the polyimide molecules and the direction of the oriented polyimide molecules are important factors to determine the threshold voltage Vth.

Further, in the method of manufacturing the thin film transistor, the film forming temperature for the channel protecting layer 5 must be lower than the film forming temperature of the semiconductor active layer 4, in order to secure the protection of the semiconductor active layer 4. This fact hinders the film quality of the channel protecting layer 5. Accordingly, the interface between the semiconductor active layer 4 and the channel protecting layer 5 is more sensitive to the electrostatic charges or the like than the interface between the semiconductor active layer 4 and the gate insulating layer 3. Thus, the thin film transistor is greatly influenced particularly at the interface between the semiconductor active layer 4 and the channel protecting layer 5, by the fixed charges of the polarized polyimide.

Next, the structure of a photo diode used as a photosensing element of an image sensor will be described with reference to FIG. 6 showing a sectional view of the photo diode.

The photo diode, as shown in FIG. 6, is of the sandwich type in which a lower electrode 11 formed of a metal such as titanium (Ti) or chromium (Cr), a photoconductive layer 12 as an a-Si:H layer segmented for each photosensing element, and a transparent electrode 13 formed of an indium/tin oxide (ITO) layer segmented in a similar manner are successively layered on a glass substrate 1. An interlayer insulating layer 9 of polyimide is formed over the entire surface of the photosensing element. Further, a wiring layer 10 made of aluminum (Al) or the like is formed over the interlayer insulating layer 9.

A conventional method of manufacturing a photo diode will be described with reference to FIGS. 7(a) to 7(d) showing cross sections of the semiconductor structure in the manufacturing steps.

A chromium (Cr) layer with a thickness of about 1000 to 1500 Angstroms is formed on the glass substrate 1, and patterned to form the lower electrode 11 (FIG. 7(a)).

Then, an amorphous silicon hydride (a-Si:H) layer with a thickness of about 1 to 2 μm is formed by a plasma CVD method. An ITO film with a thickness of about 800 Angstroms is deposited thereon by a DC sputtering method, and is patterned by photolithography and etching processes, thereby forming the transparent electrode 13. Using a regist pattern as a mask, the a-Si:H layer is etched to form the photoconductive layer 12 (FIG. 7(b)).

The surface of the semiconductor structure is coated with polyimide to form a polyimide film with a thickness of about 1 μm, the polyimide film is prebaked, shaped to have a predetermined pattern, and postbaked, thereby forming the interlayer insulating layer 9 (FIG. 7(c)).

Subsequently, an aluminum (Al) film is formed on the interlayer insulating layer 9, and the Al layer is shaped by the photolithography and etching process to form the wiring layer 10 of a predetermined pattern (FIG. 7(d)). In this way, the conventional photo diode is manufactured.

The bright/dark current ratio of the photo diode thus manufactured will be described with reference to FIGS. 8 and 9. FIG. 8 is a cross sectional view showing the photo diode before the interlayer insulating layer 9 is formed. FIG. 9 is a graph showing the relationship of a bias voltage applied to the lower electrode 11 and a dark current.

As shown in FIG. 8, a bias voltage is applied between the lower electrode 11 and the transparent electrode 13 through the photoconductive layer 12 sandwiched by them. The positive polarity of the bias voltage is connected to the lower electrode 11, while the negative polarity is connected to the transparent electrode 13. As seen from FIG. 9, when the bias voltage thus applied to the lower electrode 11 increases, the dark current increases. When the bias voltage exceeds a certain voltage, the dark current sharply increases, viz., the bright/dark current ratio (S/N ratio) abruptly decreases.

The photo diode before the interlayer insulating layer 9 is formed, is described in FIGS. 8 and 9. The same thing as FIG. 9 is correspondingly applicable for the photo diode after the interlayer insulating layer 9 is formed, provided that the polyimide molecules of the interlayer insulating layer 9 are not polarized, viz., no fixed charges are generated. The reason for this is that the electric characteristics of the photo diode remain unchanged where no fixed charges are present. Accordingly, also in the photo diode where the polyimide molecules of the interlayer insulating layer 9 are not polarized, the bright/dark current ratio (S/N ratio) will abruptly decrease when the bias voltage exceeds a certain voltage, as shown in FIG. 9.

However, in the thin film transistors manufactured by the conventional manufacturing method as mentioned above, a degree of the polarization of the polyimide molecules and the orientation of the polarized molecules are not uniform owing to various factors in the manufacturing process. Accordingly, it is almost impossible to manufacture the thin film transistors of the constant value of the threshold voltage Vth (Vth) which is very sensitive to the fixed charges caused by the polarization of the polyimide molecules. That is, the manufactured thin film transistors have large variation in the threshold voltage Vth. Further, in an image sensor or a flat panel display device using the thin film transistors manufactured as described above, its output characteristics are degraded.

Further, in the photo diodes manufactured as described above, the dark current increases with an increase of the bias voltage applied between the transparent electrode and the lower electrode under the condition that the polyimide molecules of the interlayer insulating layer interlayered between those electrodes are not polarized. Particularly, when the bias voltage progressively increases, the dark current sharply increases, so that the S/N ratio is degraded. When an image sensor is constructed using those photo diodes as photosensing elements, the sensitivity of the image sensor is reduced.

SUMMARY OF THE INVENTION

The present invention has been made in view of the above circumstances and has an object to provide a method of manufacturing a semiconductor element improved such that when the semiconductor element is a thin film transistor, a variation of the values of threshold voltage (Vth) of the thin film transistor is reduced by controlling a degree of the polarization of the polyimide molecules and the orientation of the polarized molecules, and when the semiconductor element is a photo diode, its characteristics are improved by improving its dark/bright current ratio (S/N ratio).

To solve the above problems, the present invention according to a first aspect thereof provides a method of manufacturing a semiconductor element having a semiconductor layer formed over a substrate and an organic insulating layer formed over the semiconductor layer, in which a voltage is applied to the organic insulating layer in the direction vertical to the substrate during a process of coating the organic insulating layer.

To solve the above problems, the present invention asaccording to a second aspect thereof provides a method of manufacturing a semiconductor element having a semiconductor layer formed over a substrate and an organic insulating layer formed over the semiconductor layer, in which a voltage is applied to the organic insulating layer in the direction vertical to the substrate during a baking process for initial hardening which immediately follows a process of coating the organic insulating layer.

To solve the above problems, the present invention according to a third aspect thereof provides a method of manufacturing a semiconductor element having a semiconductor layer formed over a substrate and an organic insulating layer formed over the semiconductor layer, in which a voltage is applied to the organic insulating layer in the direction vertical to the substrate during a process of coating the organic insulating layer and a baking process for initial hardening which immediately follows the coating process of the organic insulating layer.

To solve the above problems, the present invention according to a fourth aspect thereof provides a method of manufacturing a semiconductor element having a semiconductor layer formed over a substrate and an organic insulating layer formed over the semiconductor layer, in which a voltage is applied to the organic insulating layer in the direction vertical to the substrate during a process of coating the organic insulating layer and a baking process for initial hardening which immediately follows the coating process of the organic insulating layer, and during a baking process following a pattern formation of the organic insulating layer.

In the method of manufacturing a semiconductor element according to the first aspect of the present invention, a voltage is applied in the direction vertical to the substrate during a process of coating the organic insulating layer. Therefore, the molecules of the inorganic insulating layer are controlled in their orientation so as to minimize the variation of characteristics of the semiconductor element, so that the element characteristics are improved.

The present invention according to the second aspect thereof provides a method of manufacturing a semiconductor element in which a voltage is applied in the direction vertical to the substrate during a baking process for initial hardening which immediately follows a process of coating the organic insulating layer. Therefore, the molecules of the inorganic insulating layer are controlled in their orientation so as to minimize the variation of characteristics of the semiconductor elements, so that the element characteristics are improved.

The present invention according to the third aspect thereof provides a method of manufacturing a semiconductor element in which a voltage is applied in the direction vertical to the substrate during a process of coating the organic insulating layer and a baking process for initial hardening which immediately follows the coating process of the organic insulating layer. Therefore, the molecules of the inorganic insulating layer are satisfactorily controlled in their orientation so as to minimize the variation of characteristics of the semiconductor elements, so that the element characteristics are improved.

The present invention according to the fourth aspect thereof provides a method of manufacturing semiconductor elements in which a voltage is applied in the direction vertical to the substrate during a process of coating the organic insulating layer and a baking process for initial hardening which immediately follows the coating process of the organic insulating layer, and during a baking process following a pattern formation of the organic insulating layer. Therefore, the molecules of the inorganic insulating layer are completely controlled in their orientation so as to minimize the variation of characteristics of the semiconductor element, so that the element characteristics are improved.

DETAILED DESCRIPTION OF THE PREFERRED EMBODIMENTS

The preferred embodiments of the present invention will be described with reference to the accompanying drawings.

In the description to follow, the semiconductor elements to be manufactured according to the present invention are a thin film transistor used as a drive element for an image sensor or for a flat panel display device, and a photo diode used as a photosensing element for an image sensor. The thin film transistor of the present invention has the structure similar to that of the conventional thin film transistor of the inverse stagger type shown in FIG. 1. The photo diode of the present invention has also the structure similar to that of the conventional photo diode shown in FIG. 8.

Figure 1:
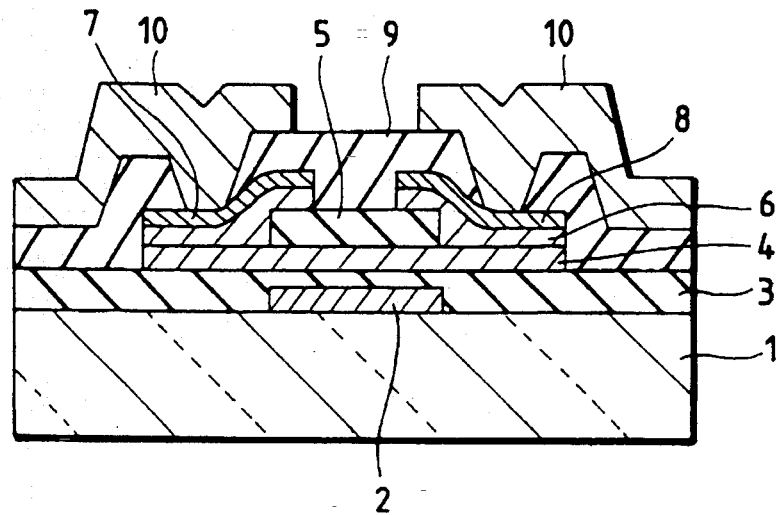
FIG. 1 is a cross sectional view showing a conventional thin film transistor of the inverse stagger type.
Figure 3:
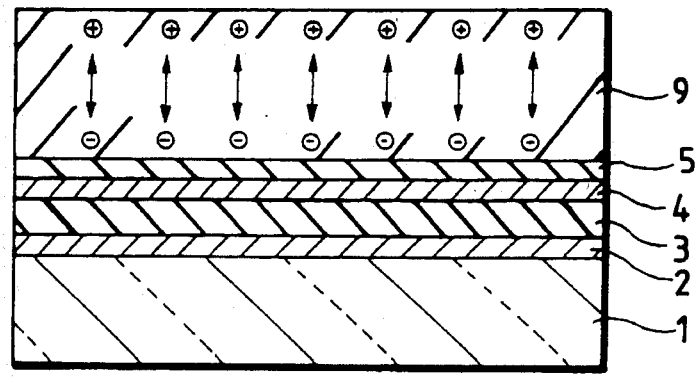
FIG. 3 is a cross sectional view for explaining fixed charges resulting from the polarization of molecules of an organic insulating material.
Figure 4:
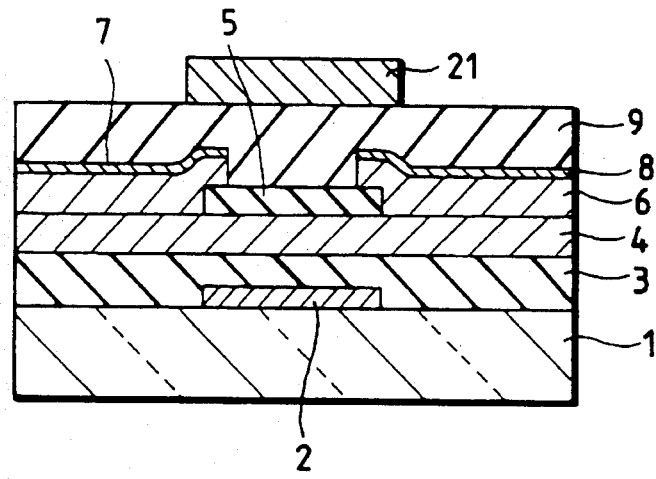
FIG. 4 is a cross sectional view showing a thin film transistor with a top gate electrode.
Figure 2A:
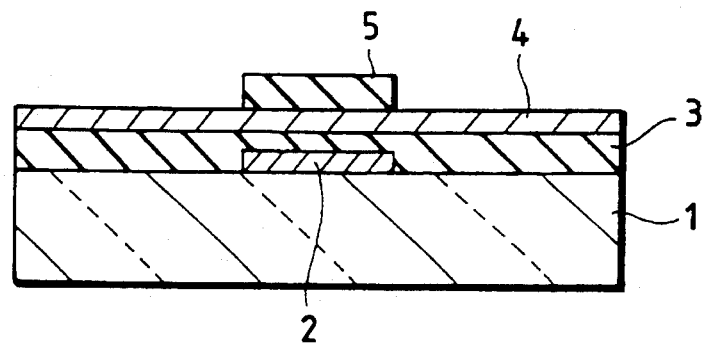
FIG. 2(a) to 2(d) are sectional views showing the steps of a conventional method of manufacturing a thin film transistor (TFT)
Figure 2B:
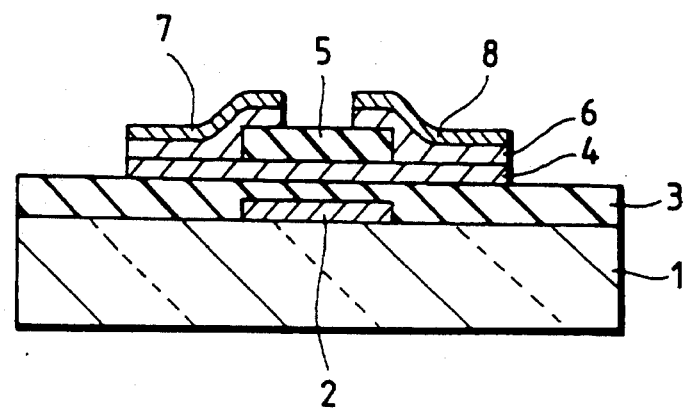
Figure 2C:
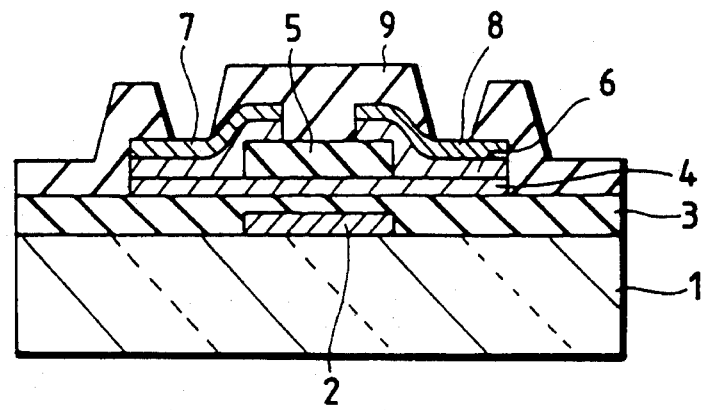
Figure 2D:
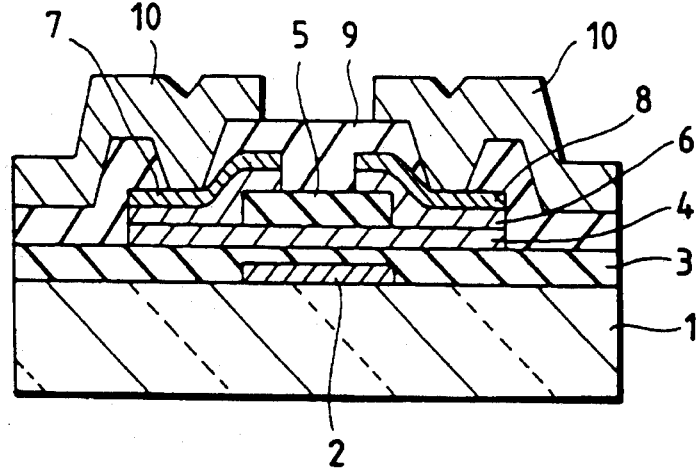
Figure 5:
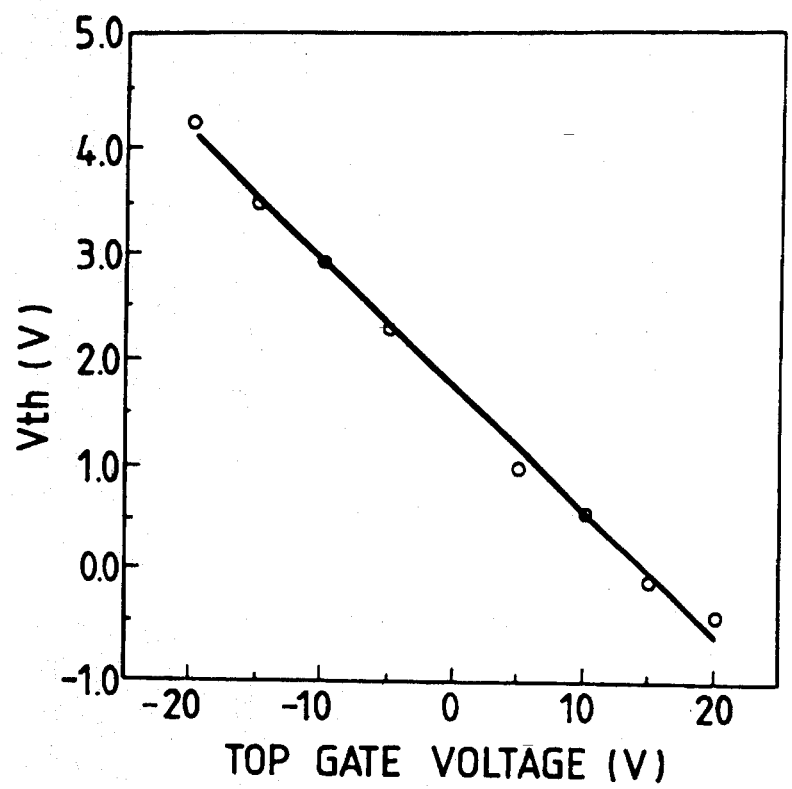
FIG. 5 is a graph showing the relationship of a top gate voltage vs. a threshold voltage Vth of the thin film transistor shown in FIG. 4.
Figure 6:
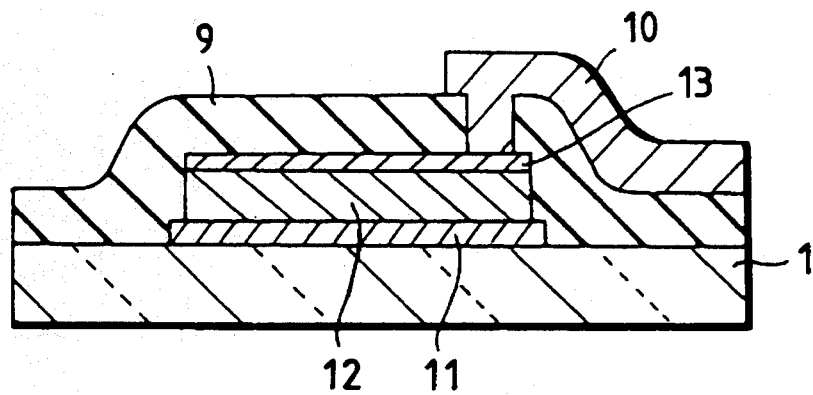
FIG. 6 is a cross sectional view showing a photo diode.
Figure 7A:
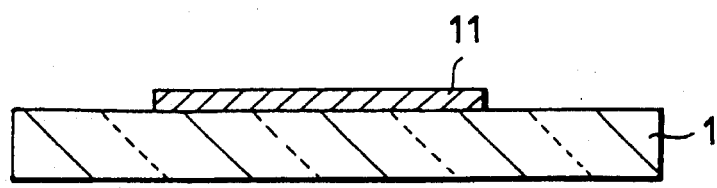
FIGS. 7(a) to 7(d) are sectional views showing the steps of a conventional method of manufacturing a photo diode.
Figure 7B:
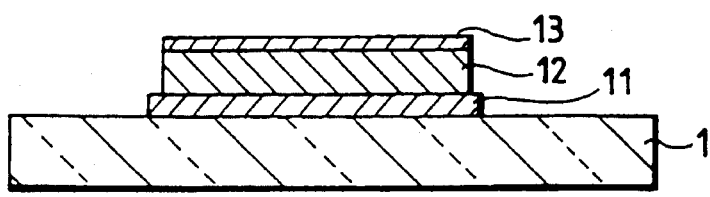
Figure 7C:
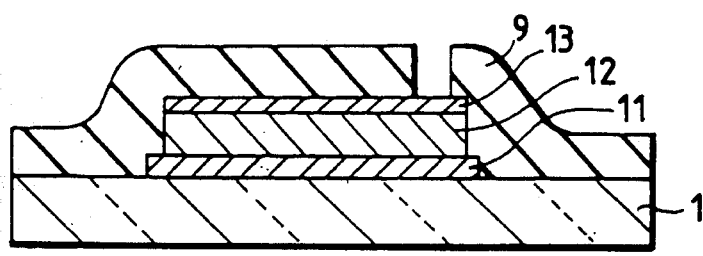
Figure 7D:
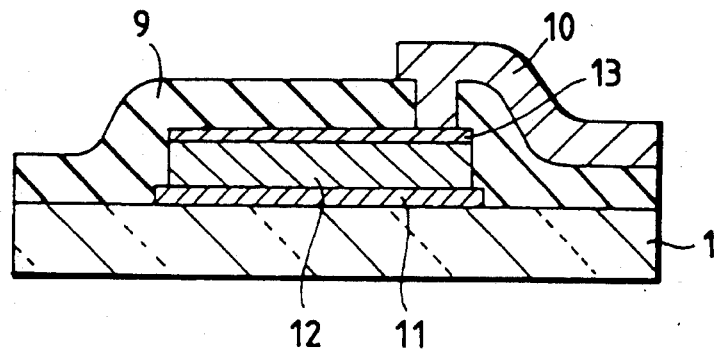

The thin film transistor of the inverse stagger type relating to the present invention will be described with reference to FIG. 1. As shown, in the thin film transistor (TFT), a gate electrode 2 of chromium (Cr) or tantalum (Ta), a gate insulating layer 3 of a silicon nitride (SiNx) film, a semiconductor active layer 4 of nondoped amorphous silicon hydride (i-a-Si:H), a channel protecting layer 5 of a silicon nitride (SiNx) film, an ohmic contact layer 6 of n⁺ amorphous silicon hydride (n⁺ a-Si:H), a source electrode 7 and a drain electrode 8, an interlayer insulating layer 9 of polyimide, and a wiring layer 10 of molybdenum (Mo), aluminum (Al) or the like are layered on a glass substrate 1 in this order.

In the thin film transistor manufactured by the method of the present invention, a degree of polarization and the orientation of the polarized polyimide molecules in the interlayer insulating layer 9 are controlled so that the manufactured thin film transistors have intended values of the threshold voltage Vth. It is possible to manufacture the thin film transistors so as to have the values of the threshold voltage Vth as designed by preventing the polarized polyimide molecules from being oriented and hence by preventing formation of the fixed charges therein. Alternatively, the threshold voltage values Vth can be adjusted to specific values in a manner that during the manufacturing process, a preset fixed potential is retained in the interlayer insulating layer 9 by intentionally orienting the polyimide molecules in a specific direction to form poralization.

A method of controlling the orientation of the polyimide molecules in the interlayer insulating layer, which is essential to the semiconductor element manufacturing method of the present invention, will be described.

The fixed charges are formed in the interlayer insulating layer 9 of polyimide in a manner that immediately after the polyimide coating process under influence of an electrostatic field existing therearound, the polyimide molecules of the insulating layer are polarized and oriented in the direction vertical to the substrate 1, and baked and fixed in this state. The fixed charges, which result from the polarization of the polyimide molecules, give an electrical influence to the interface between the semiconductor active layer 4 and the channel protecting layer 5.

In the thin film transistor manufacturing method of the present invention, a degree of polarization and the orientation of the polarized polyimide molecules are controlled by applying an electric field of a proper intensity in the direction vertical to the substrate during a period from a coating process of liquid polyimide to a process of baking the coated polyimide film to harden the film. For example, to remove the fixed charges resulting from the orientation of the polarized polyimide molecules, an electric field of such a direction and such an intensity as to neutralize the polarized state of the polyimide molecules is applied.

To apply the electric field, parallel plate electrodes or an electric field applying wire is located inside or outside an apparatus of polyimide spin coater, and an electric field is applied during the spin coating operation. Even in the case of applying an electric field by the electric field applying wire, the electric field is uniformly applied to the polyimide on the substrate 1 because the substrate 1 on the spin coater is rotating. As a matter of course, when the parallel plate electrodes are used, the electric field is uniformly applied.

An electric field applying head may be used. This head can uniformly apply an electric field to the entire surface of the substrate 1 when the head is moved radially across the spin coater.

If correlation between the intensity and the direction of the electric field applied to the thin film transistor and the threshold voltage Vth of the thin film transistor is previously obtained by empirical tests or the like, the polarization and the orientation of the polyimide molecules can be controlled as desired by controlling the electric field. In other words, the thin film transistor can be designed so as to have a desired threshold voltage Vth.

A method of manufacturing a thin film transistor according to the present invention will be concretely described with reference to FIGS. 10(a) to 10(f).

Figure 10A:
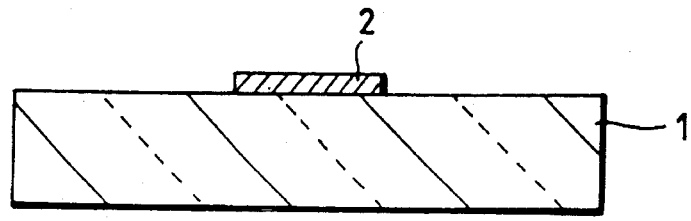
FIGS. 10(a) to 10(f) are sectional views showing the steps of a method of manufacturing a thin film transistor according to the present invention.
Figure 10B:
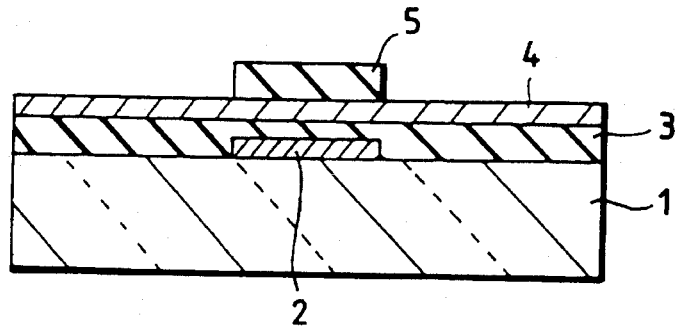
Figure 10C:
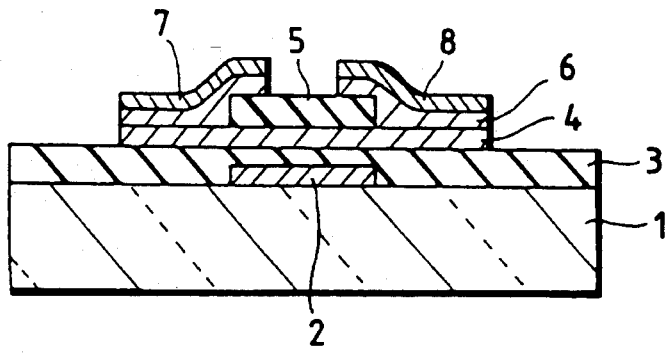
Figure 10D:
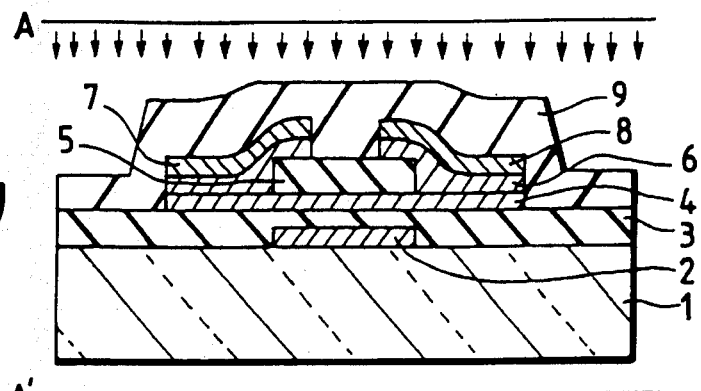
Figure 10E:
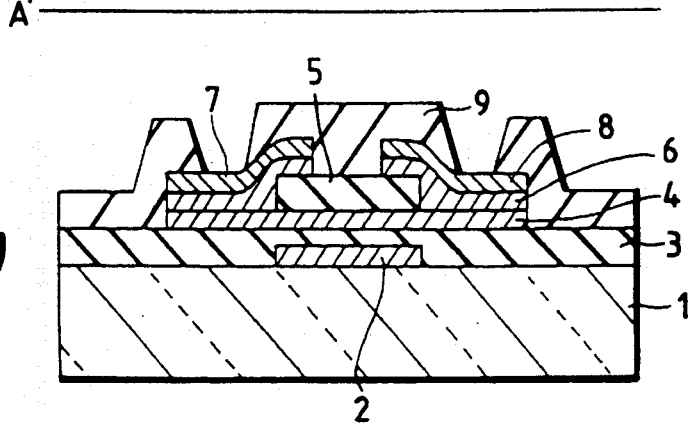

FIGS. 10(a) to 10 (f) are sectional views showing the steps of a method of manufacturing a thin film transistor according to the present invention.

To form the gate electrode 2, a metal such as chromium (Cr1), tantalum (Ta) or titanium (Ti) is deposited on the glass substrate 1 by a DC sputtering method to form a film with a thickness of about 500 to 1500 Angstroms. The formed metal film is shaped to have a predetermined pattern by photolithography and etching process (FIG. 10(a)).

Then, by a plasma CVD method, a silicon nitride film (SiNx) of the lower layer as the gate insulating layer 3, an amorphous silicon hydride (a-Si:H) layer as the semiconductor active layer 4, and a silicon nitride film (SiNx) of the upper layer as the channel protecting layer 5 are successively formed in a vacuum condition, approximately 3000, 500, and 1500 Angstroms thick, respectively. The upper SiNx layer as the channel protecting layer 5 is patterned to have the width equal to that of the gate electrode 2 by photolithography and etching process using a reverse-side exposure or the like so that the channel protecting layer 5 is completed (FIG. 10(b)).

An n⁺ a-Si:H layer as the ohmic contact layer 6 is formed, approximately 1000 to 2000 Angstroms thick, by a plasma CVD method. A layer of a metal such as chromium (Cr2), tantalum (Ta) or titanium (Ti) as the source electrode 7 and the drain electrode 8, is formed on the n⁺ a-Si:H layer, approximately 1000 to 2000 Angstroms thick. The Cr2 layer, the n⁺ a-Si:H layer, and the a-Si:H layer are successively patterned by photolithography and etching process, thereby forming the source electrode 7 and drain electrode 8, the ohmic contact layer 6, and the semiconductor active layer 4 (FIG. 10(c)).

Then, the surface of the semiconductor structure is coated with polyimide (PI) by a spin coater to form the interlayer insulating layer 9 of approximately 1 μm thickness. An electric field is applied between parallel plate electrodes A—A' disposed above and under the spin coater in order to control the polarization and the orientation of the polyimide molecules (FIG. 10(d)). The electric field is a DC or AC electric field, and has the field intensity of 1 to $10^5$ V/cm and such a direction as to neutralize the orientation of the polyimide molecules. With the application, the residual fixed charges by the polyimide molecules will be removed.

To the initial hardening of polyimide, the semiconductor structure thus formed is prebaked at temperature 150° to 200° C. by a clean oven or a hot plate. Thereafter, the polyimide layer is patterned, and postbaked at temperature 250° C., thereby to form the interlayer insulating layer 9 (FIG. 10(e)).

Figure 10F:
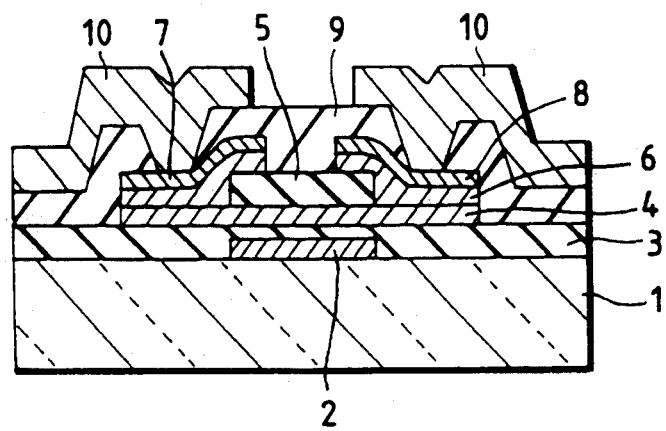

Aluminum (Al) or the like is formed on the interlayer insulating layer 9 and the like, approximately 1 μm thick, by a DC sputtering method, and the Al layer is patterned to form the wiring layer 10 by photolithography and etching process (FIG. 10(f)). In this way, the thin film transistor is completed.

As described above, in the manufacturing method of the present invention, an electric field, which is applied during the coating process of polyimide, is selected on the basis of the previously obtained correlation between the field intensity and the direction of the applied voltage and the threshold voltage Vth of the thin film transistor. Accordingly, a degree of polarization and the orientation of the polarized polyimide molecules can be intentionally controlled. Hence, the fixed charges by the polyimide can be controlled so as to obtain a desired value of the threshold voltage Vth of the thin film transistor. The resultant thin film transistors little vary in the threshold voltage Vth values.

The electric field may be applied during the polyimide baking process in place of the polyimide coating process. More preferably, it may be applied during both the polyimide baking process and the polyimide coating process. Application of the electric field during the postbaking process will ensure a more reliable control of the polarization and orientation of the polarized polyimide molecules. Accordingly, the variation of the threshold voltage Vth values of the manufactured thin film transistors is further reduced.

An image sensor and a flat panel display device, which are constructed with those thin film transistors manufactured by the manufacturing method as mentioned above, will have stable output characteristics and improved reliability.

Next, a method of manufacturing a photo diode according to the present invention will be described. The photo diode of this embodiment has the structure as shown in a sectional view of FIG. 11.

Figure 8:
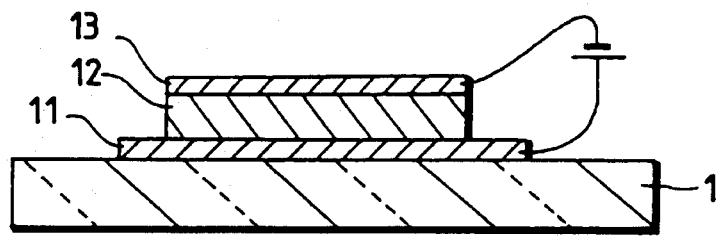
FIG. 8 is a cross sectional view showing the photo diode before an interlayer insulating layer is formed.
Figure 11:
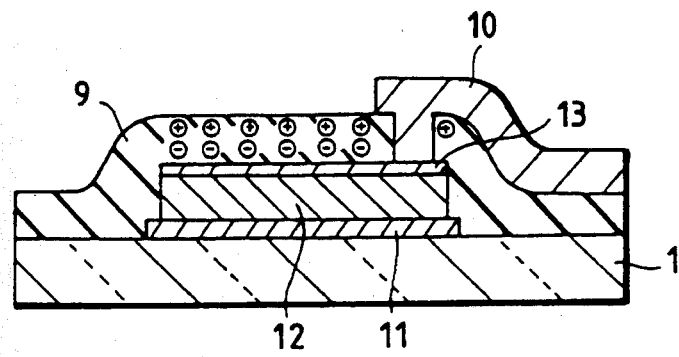
FIG. 11 is a sectional view showing a photo diode relating to the present invention.

As shown in FIG. 11, in a photo diode manufactured by the manufacturing method of the present invention, like the photo diode shown in FIG. 8, a lower electrode 11 formed of a metal such as titanium (Ti) or a chromium (Cr), a photoconductive layer 12 formed of an a-Si:H layer segmented for each photosensing element, and a transparent electrode 13 formed of an indium/tin oxide (ITO) segmented in a like manner are successively layered on a glass substrate 1. An interlayer insulating layer 9 of polyimide is formed over the entire surface of the photosensing element. Further, a wiring layer 10 made of aluminum (Al) or the like is formed over the interlayer insulating layer 9.

As shown in FIG. 11, in the photo diode relating to the present invention, specific fixed charges are generated in the interlayer insulating layer 9 by controlling the polarization and the resultant orientation of the molecules of polyimide constituting the interlayer insulating layer 9. In this embodiment, the polyimide molecules are polarized such that negative charges stay in a lower region of the interlayer insulating layer 9, which is closer to the transparent electrode 13, and positive charges stay in an upper region thereof.

In other words, in the manufacturing method of the present invention, to improve the bright/dark current ratio (S/N ratio) of the photo diode, the fixed charges are intentionally caused in the interlayer insulating layer 9 by controlling the polarization and the resultant orientation of the molecules of polyimide constituting the interlayer insulating layer 9, and increase of the dark current is suppressed by the generated fixed charges.

A method of manufacturing a photo diode according to the present invention will be described with reference to FIG. 12. FIGS. 12(a) to 12(e) are sectional views showing the steps of a method of manufacturing a photo diode according to the present invention. A chromium (Cr) layer of approximately 1000 to 1500 Angstroms thickness is formed on the glass substrate 1 by a DC sputtering method, and patterned by photolithography and etching process, thereby to form the lower electrode 11 (FIG. 11(a)).

An amorphous silicon hydride (a-Si:H) layer is formed on the structure, approximately 1 to 2 μm thick, by a plasma CVD method. An ITO film is then deposited thereon, approximately 800 Angstroms thick, by a DC sputtering method, and the ITO of a predetermined pattern is formed by photolithography and etching process, thereby forming the transparent electrode 13. Using a regist pattern as a mask, the a-Si:H layer is etched to form the photoconductive layer 12 (FIG. 12(b)).

Then, the surface of the semiconductor structure is coated with polyimide (PI) by a spin coater to form the interlayer insulating layer 9 of approximately 1 μm thickness. An electric field is applied between parallel plate electrodes A—A' disposed above and under the spin coater in order to control the polarization and the orientation of the polyimide molecules. The electric field is a DC or AC electric field, and has the field intensity of 1 to $10^5$ V/cm and the direction vertical to the glass substrate 1. As the result of the application of the electric field, the polyimide molecules are polarized such that their positive poles are located in the upper part of the interlayer insulating layer 9 and their negative poles are located in the lower part thereof. In this way, the fixed charges are generated (FIG. 12(c)).

For the initial hardening of polyimide, the semiconductor structure thus formed is prebaked at temperature 150°to 200° C. by a clean oven or a hot plate. Thereafter, the polyimide layer is patterned, and postbaked at temperature 250° C., thereby to form the interlayer insulating layer 9 (FIG. 12(d)).

Figure 12A:
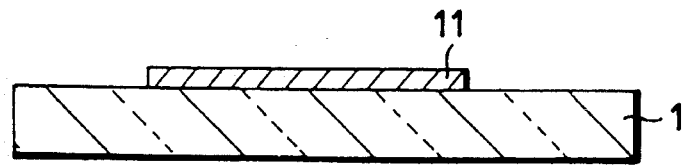
FIGS. 12(a) to 12(e) are sectional views showing the steps of a method of manufacturing a photo diode according to the present invetion.
Figure 12B:
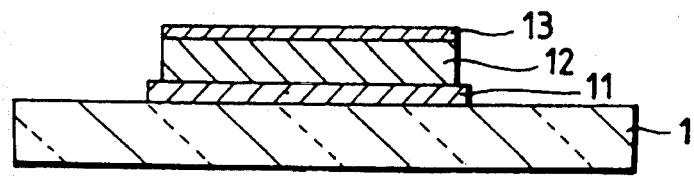
Figure 12C:
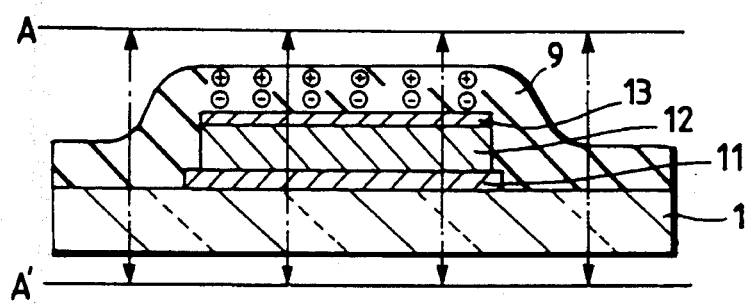
Figure 12D:
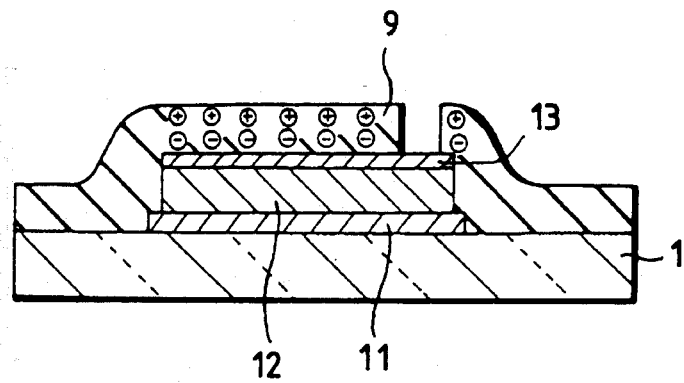
Figure 12E:
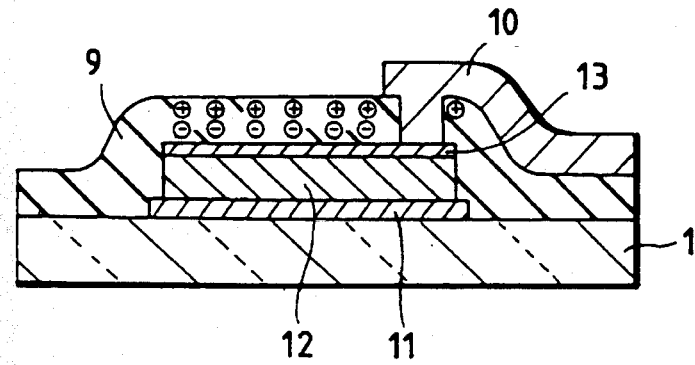

An aluminum (Al) film or the like of approximately 1 μm thickness is formed on the interlayer insulating layer 9 by a DC sputtering method, and the Al layer is patterned to form the wiring layer 10 by photolithography and etching process (FIG. 12(e)). In this way, the photo diode in which the interlayer insulating layer 9 retains fixed charges, is formed.

The bright/dark current ratio (S/N ratio) characteristic of the photo diode manufactured by the manufacturing method of the present invention will be described with reference to FIGS. 13 and 14.

Figure 13:
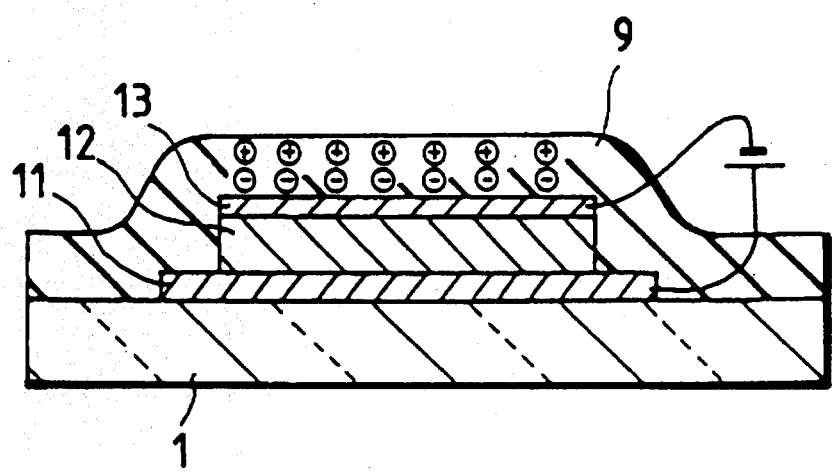
FIG. 13 is a cross sectional view showing the photo diode of the present invention where a bias voltage is applied to the lower electrode.
Figure 14:
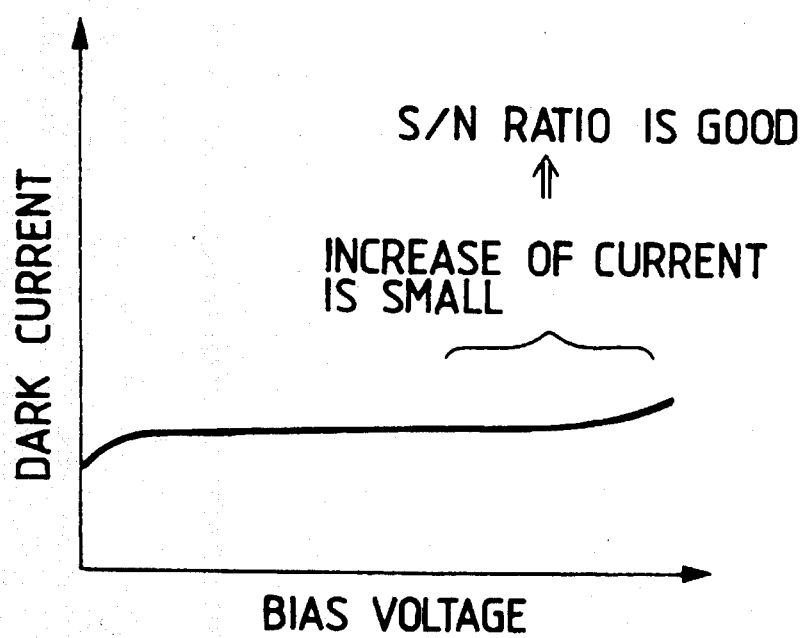
FIG. 14 is a graph showing the relationship of a bias voltage applied to the lower electrode and a dark current.

FIG. 13 is a cross sectional view showing the photo diode where a bias voltage is applied to the transparent electrode 13 and the lower electrode 11. FIG. 14 is a graph showing the relationship of a bias voltage applied to the lower electrode and a dark current.

As shown in FIG. 13, a bias voltage is applied such that the positive terminal of a voltage source is connected to the lower electrode 11 and the negative terminal thereof is connected to the transparent electrode 13. As the result of the bias voltage application, the polyimide molecules are polarized such that their positive poles are located in the upper part of the interlayer insulating layer 9 and their negative poles are located in the lower part thereof.

Figure 9:
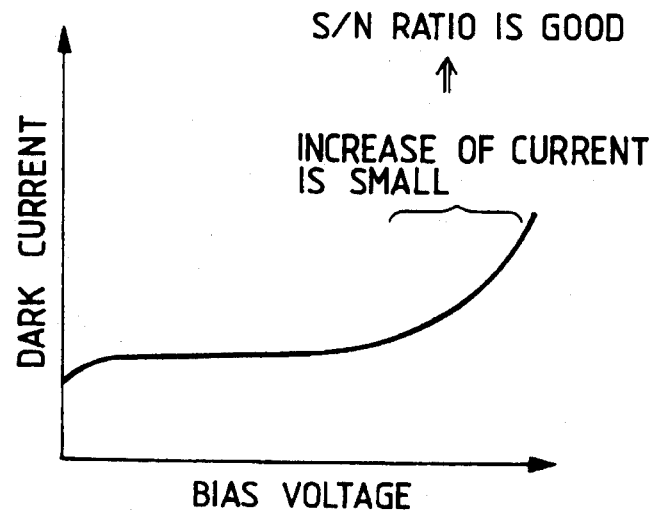
FIG. 9 is a graph showing the relationship of a bias voltage applied to the lower electrode and a dark current.

In the conventional photo diode, the dark current sharply increases when the increased bias voltage exceeds a preset value, as shown in FIG. 9. On the other hand, increase of the dark current with respect to the bias voltage is small as shown in FIG. 14 in the photo diode of the invention which contains the fixed charges distributed such that positive charges are located in the upper part of the interlayer insulating layer 9 and the negative charges are located in the lower part thereof as shown in FIG. 13. Accordingly, the S/N ratio of the resultant photo diode is good.

As described above, in the method of manufacturing a photo diode according to the present invention, an electric field of a proper field intensity is applied in a specific direction to the photo diode structure during the polyimide coating process before the polyimide layer to serve as the interlayer insulating layer 9 is hardened. Under the electric field, the polyimide molecules are polarized such that their positive poles are located in the upper part of the interlayer insulating layer 9 and their negative poles are located in the lower part thereof. Accordingly, the increase of the dark current is suppressed, and the S/N ratio is improved. The element characteristics can be designed as intended if the intensity and direction of the electric field to be applied are determined empirically in advance.

The electric field may be applied during the prebaking process for hardening instead of the polyimide coating process. More preferably, it may be applied during both the polyimide prebaking process and the polyimide coating process. Application of the electric field during the postbaking process, which follows the patterning of the polyimide film, will ensure a more reliable generation of the fixed charges.

The parallel plate electrodes, the electric field applying wire, or the electric field applying head may be used for the electric field application, as in the method of manufacturing thin film transistors already mentioned.

As described above, in the method of manufacturing a semiconductor element according to a first aspect of the present invention, a voltage is applied in the direction vertical to the substrate during a process of coating the organic insulating layer. Therefore, the molecules of the inorganic insulating layer are controlled in their orientation so as to minimize a variation of the threshold voltage Vth values of the manufactured semiconductor elements, so that the variation of characteristics of the semiconductor element is reduced and the characterisitcs thereof are improved.

In a method of manufacturing a semiconductor element accordingto a second aspect of the present invention, a voltage is applied in the direction vertical to the substrate during a baking process for initial hardening which immediately follows a process of coating the organic insulating layer. Therefore, the molecules of the inorganic insulating layer are controlled in their orientation so as to minimize a variation of the threshold voltage Vth values of the manufactured semiconductor elements, so that the variation of the characteristics of the semiconductor element is reduced and the characteristics thereof are improved.

In a method of manufacturing a semiconductor element according to a third aspect of the present invention, a voltage is applied in the direction vertical to the substrate during a process of coating the organic insulating layer and a baking process for initial hardening which immediately follows the coating process of the organic insulating layer. Therefore, the molecules of the inorganic insulating layer are satisfactorily controlled in their orientation so as to minimize a variation of the threshold voltage Vth values of the manufactured semiconductor elements, so that the variation of the characteristics of the semiconductor element is reduced and the characteristics thereof are improved.

In a method of manufacturing a semiconductor element according to a fourth aspect of the present invention, a voltage is applied in the direction vertical to the substrate during a process of coating the organic insulating layer and a baking process for initial hardening which immediately follows the coating process of the organic insulating layer, and during a baking process following a pattern formation of the organic insulating layer. Therefore, the molecules of the inorganic insulating layer are completely controlled in their orientation so as to minimize a variation of the threshold voltage Vth values of the manufactured semiconductor elements, so that the variation of the charactieristics of the semiconductor element is reduced and the characteristics thereof are improved.

What is claimed is:

1. A method of manufacturing a semiconductor element, comprising the steps of:

forming a semiconductor layer over a substrate;

placing liquid organic insulating material over said semiconductor layer to form an organic insulating layer while an electric field is applied to said liquid organic insulating material in a direction vertical to said substrate; and baking said liquid organic insulating material for initial hardening immediately after said placing step while an electric field is applied to said liquid organic insulating material in the direction vertical to said substrate.

2. The method of manufacturing a semiconductor element as claimed in claim 1, wherein said semiconductor element is a thin film transistor and said method further comprising the steps of:

forming a gate electrode on said substrate;

forming a gate insulating layer on said gate electrode and below said semiconductor layer;

forming a channel protecting layer on said semiconductor layer and below said organic insulating layer; and forming source and drain electrodes at both sides of said channel protecting layer.

3. The method of manufacturing a semiconductor element as claimed in claim 1, further comprising the steps of:

forming a metal electrode on said substrate and below said semiconductor layer as a photoconductive layer; and forming a transparent electrode on said semiconductor layer and below said organic insulating layer.

4. The method of manufacturing a semiconductor element as claimed in claim 1, wherein said electric field at said organic insulating layer is 1 to $10^5$ V/cm.

5. A method of manufacturing a semiconductor element, comprising the steps of:

forming a semiconductor layer over a substrate;

placing liquid organic insulating material over said semiconductor layer to form an organic insulating layer while an electric field is applied to said liquid organic insulating material in a direction vertical to said substrate;

prebaking said liquid organic insulating material for initial hardening immediately after said placing step while an electric field is applied to said liquid organic insulating material in the direction vertical to said substrate; and postbaking said organic insulating layer after a pattern formation of said organic insulating layer while an electric field is applied to said organic insulating layer in the direction vertical to said substrate.

\* \* \* \* \*